United States Patent
Tan et al.

(10) Patent No.: US 7,573,931 B2
(45) Date of Patent: Aug. 11, 2009

(54) VERTICAL-CAVITY SURFACE-EMITTING LASER INCLUDING A SUPPORTED AIRGAP DISTRIBUTED BRAGG REFLECTOR

(75) Inventors: Michael Renne Ty Tan, Menlo Park, CA (US); Chao Kun Lin, Fremont, CA (US); Scott W. Corzine, Sunnyvale, CA (US); Jintian Zhu, Palo Alto, CA (US); Michael H. Leary, Fremont, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 10/042,590

(22) Filed: Jan. 9, 2002

(65) Prior Publication Data

US 2003/0128733 A1 Jul. 10, 2003

(51) Int. Cl.
*H01S 3/08* (2006.01)
*H01S 5/343* (2006.01)
(52) U.S. Cl. .................................. 372/96; 372/44.01
(58) Field of Classification Search .................. 372/46, 372/96, 43.01; 257/98, 55, 79, 80, 81, 82, 257/101, 102, 103; 359/359, 585, 584; 438/22, 438/37, 46
See application file for complete search history.

(56) References Cited

U.S. PATENT DOCUMENTS 6,306,672 B1 * 10/2001 Kim ............................ 438/22

* cited by examiner

*Primary Examiner*—Hung T Vy

(57) ABSTRACT

A vertical-cavity surface-emitting laser incorporating a supported air gap distributed Bragg reflector is disclosed. The supported air gap DBR includes a regrowth layer of material that provides mechanical support for the original material layers. The supported air gap DBR is fabricated by first growing alternating pairs of a first material and a sacrificial material over a suitable substrate. The layer pairs of the first material and sacrificial material are covered by a suitable dielectric material. The dielectric material is then selectively removed exposing regions of the first material and sacrificial material where selective regrowth of additional material is desired. The selective regrowth of the additional material provides mechanical support for the semiconductor material that remains after a selective etch removal of the sacrificial material.

7 Claims, 7 Drawing Sheets

VERTICAL-CAVITY SURFACE-EMITTING LASER INCLUDING A SUPPORTED AIRGAP DISTRIBUTED BRAGG REFLECTOR

TECHNICAL FIELD

The invention relates generally to semiconductor light emitting devices and, more particularly, to a vertical-cavity surface-emitting laser including an airgap distributed Bragg reflector (DBR) that resists collapse.

BACKGROUND OF THE INVENTION

Light emitting devices and particularly vertical-cavity surface-emitting lasers (VCSELs) are useful in many communication applications, such as, for example, optical fiber communication. VCSELs generally include a light emitting region (commonly referred to as an "active region") located between a pair of DBRs fabricated on a semiconductor substrate. The VCSEL also includes various buffer layers, optical confinement regions, current confinement regions and electrical conductors. Light is emitted from the active region, reflected by the DBRs and emitted from one surface of the VCSEL. Generally, depending on the desired application, a VCSEL can emit light at either relatively short wavelengths (i.e., on the order of 850 nanometers (nm)) or relatively long wavelengths (i.e., on the order of 1300-1600 nm). Most optical communications applications require that the emitted light be at relatively long wavelengths. Furthermore, it is desirable to fabricate the DBRs, active region, buffer layers, and the optical and current confinement regions during a single epitaxial growth. Generally, active regions capable of emitting light at relatively long wavelengths can be fabricated using the indium phosphide (InP) material system.

Unfortunately, single epitaxial growth, long wavelength VCSELs are difficult to fabricate in the InP material system because of the difficulty in fabricating high quality DBRs having a high index contrast.

High index contrast DBRs can be fabricated in the gallium arsenide (GaAs) material system, but fabricating an active region that is capable of emitting long wavelength light in the GaAs material system has proven difficult.

When using the InP material system to fabricate a VCSEL, the available material choices for DBRs are limited to indium gallium arsenide phosphide/indium phosphide (InGaAsP/InP) or indium aluminum arsenide/indium aluminum gallium arsenide (InAlAs/InAlGaAs), both of which require lattice matching to the substrate material. These compositions also exhibit a low index contrast, thereby requiring many pairs of layers to obtain the desired 99.9% reflectivity and both exhibit a relatively narrow stopband width. Indeed, InGaAsP/InP and InAlAs/InAlGaAs DBRs may require as many as 65 layer pairs to obtain the desired 99.9% reflectivity. DBRs fabricated using aluminum arsenide antimonide/aluminum gallium arsenide antimonide (AlAsSb/AlGaAsSb) exhibit a somewhat higher refractive index contrast, but still require lattice matching and a relatively large number of layer pairs.

One type of DBR that has the desired reflectivity, a low number of layer pairs and a high stopband width is known as an air/semiconductor DBR. An air/semiconductor DBR exhibits a high index contrast between the layers because the semiconductor layers are separated by air. In such a DBR reflectivity of >99.9% can be obtained using only three pairs of air/semiconductor layers.

An air/semiconductor DBR is fabricated by growing or depositing epitaxial films that have a high etch selectivity, such as InGaAs and InP. For example, nearly complete etch selectivity can be obtained if the InGaAs material is used as a "sacrificial" layer that is etched by a solution of ferric chloride ($FeCi_3:H_2O$). In such a DBR, the layers are grown or deposited and then etched to form a mesa exposing the layers. A suitable etch mask, such as silicon dioxide ($SiO_2$) is deposited and patterned, exposing portions of the mesa where the airgap DBR is to be defined. The sacrificial InGaAs layer(s) is removed by the ferric chloride etch resulting in a suspended airgap DBR supported by the unetched regions.

Unfortunately, such a DBR suffers from poor mechanical stability. The airgap DBR may buckle due to residual stress in the epitaxial layers or may collapse due to capillary forces created during the etching, rinsing and drying processes. Furthermore, conventional airgap DBRs are limited in size and the thickness of the layers is difficult to precisely control because of the above-mentioned deficiencies.

Therefore, there is a need in the industry for a vertical-cavity surface-emitting laser (VSCEL) including a mechanically stable airgap DBR that can be easily and economically fabricated with a high degree of precision.

SUMMARY OF THE INVENTION

The invention provides a vertical-cavity surface-emitting laser (VSCEL) incorporating a supported airgap distributed Bragg reflector (DBR). The supported airgap DBR includes a layer of material that provides mechanical support for the layers that comprise the DBR. The supported airgap DBR is fabricated by first growing alternating pairs of a first material and a sacrificial material over a suitable substrate. The layer pairs of the first material and sacrificial material are covered by a suitable dielectric material. The dielectric material is then selectively removed exposing regions of the first material and sacrificial material where selective application of additional material is desired. The selective application of additional material provides mechanical support for the first material that remains after a selective etch removal of the sacrificial material.

The invention has numerous advantages, a few which are delineated, hereafter, as merely examples.

An advantage of the invention is that it provides a mechanically stable airgap DBR. Another advantage of the invention is that it provides a mechanically stable, high index contrast DBR in a long wavelength output laser device. Another advantage of the invention is that it lends itself to economical manufacture during the fabrication of a semiconductor laser device.

Other features and advantages of the invention will become apparent to one with skill in the art upon examination of the following drawings and detailed description. These additional features and advantages are intended to be included within the scope of the invention.

BRIEF DESCRIPTION OF THE DRAWINGS

The invention, as defined in the claims, can be better understood with reference to the following drawings. The components within the drawings are not necessarily to scale relative to each other, emphasis instead being placed upon clearly illustrating the principles of the invention.

DETAILED DESCRIPTION OF THE INVENTION

While described below using an indium phosphide (InP) substrate and InP semiconductor and regrowth layers to define a semiconductor DBR and related airgap support structure, the invention is applicable to any device in which a mechanically stable airgap structure is desirable. For example, the invention is applicable to a dielectric DBR. The invention is also applicable to alternative materials and/or compounds that are deposited instead of grown. Further, while described below as a supported airgap DBR in which the gap is filled with air, the gap may also contain other substances that provide a high index contrast with the layers of material at the gap/semiconductor interface.

Figure 1A:
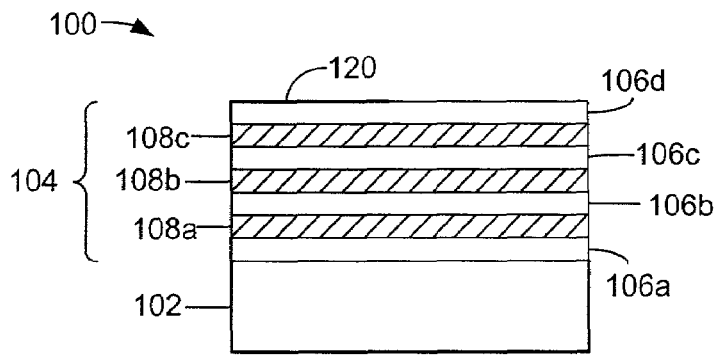
FIGS. 1A through 1D are schematic diagrams collectively illustrating an airgap distributed Bragg reflector (DBR) constructed in accordance with the invention.

FIGS. 1A through 1D are schematic diagrams collectively illustrating an airgap distributed Bragg reflector (DBR) constructed in accordance with an embodiment of the invention. In FIG. 1A an epitaxial layer structure 100 has been defined in the shape of a mesa. The epitaxial layer structure 100 includes an indium phosphide (InP) substrate 102 over which alternating layers of a first material (in this example, a semiconductor material) and a sacrificial material have been grown using a single metal organic chemical vapor deposition (MOCVD) growth step. Alternatively, other semiconductor growth techniques may be used to grow the layers. Further, the airgap distributed Bragg reflector (DBR) may alternatively be constructed of materials and/or compounds that are deposited instead of grown, and may include non-semiconductor material, such as used to form a dielectric DBR.

The alternating layers include a layer of semiconductor material 106a followed by a layer of sacrificial material 108a. These layers 106 and 108 are repeated until the desired number of material layers are grown. In the example shown in FIG. 1A, four alternating layers (106a, 106b, 106c and 106d) of semiconductor material and three alternating layers (108a, 108b and 108c) of sacrificial material are grown. The alternating layers 106 and 108 will form a DBR 104. In the embodiment shown in FIG. 1A, the semiconductor material is indium phosphide (InP) while the sacrificial material is indium gallium arsenide (InGaAs). The number of alternating layers of the InP and the InGaAs will depend upon the desired reflectivity of the DBR 104. For example, because the DBR 104 in FIG. 1A will eventually comprise an InP/air DBR, only 3 layer pairs plus a first structural layer are illustrated in FIG. 1A. It should be noted that, depending upon the desired reflectivity of the DBR 104 and whether a first layer of the DBR 104 is used for structural properties, any number of layer pairs could be grown over the InP substrate 102.

In accordance with an embodiment of the invention, the epitaxial layers 106 and 108 have a high etch selectivity. In this manner, nearly complete etch selectivity can be obtained between the InGaAs sacrificial layers 108 and the InP semiconductor layers 108 by using a ferric chloride ($FeCi_3 : H_2O$) etchant as will be described below.

Still referring to FIG. 1A, portions of the epitaxial layer structure 100 are covered by a suitable etch mask 120. The exposed portions of the epitaxial layer structure 100 are etched to form a suitable mesa structure from which the distributed Bragg reflector will be formed. The etch mask 120 can be, for example but not limited to, silicon dioxide ($SiO_2$), silicon nitride ($Si_3N_4$), or a photoresist material. The etch mask 120 is deposited on the epitaxial layer structure 100 and is patterned as appropriate to define particular features on the epitaxial layer structure 100.

Figure 1B:
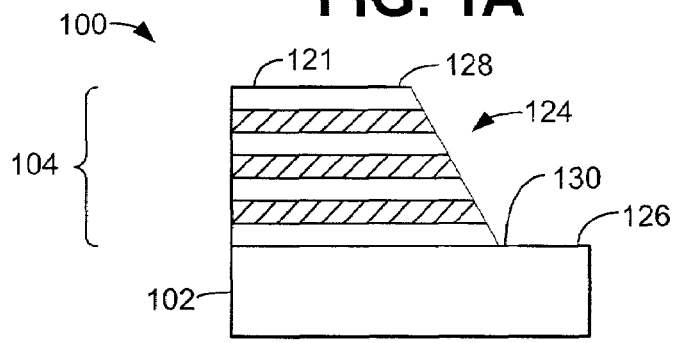

In FIG. 1B, the epitaxial layer structure 100 is etched so that the surface 124 of the semiconductor material 106 and the sacrificial material 108 is exposed at an angle other than perpendicular to the major surface 126 of the substrate layer 102. After the mesa is defined, the remainder of the etch mask 120 is removed and a dielectric mask 121 is applied to all surfaces of the epitaxial layer structure 100. Portions of the dielectric mask 121 are then selectively patterned and removed, thus exposing portions of the epitaxial layer structure 100 where it is desired to grow the InP support structure to be described below. The exposed surface 124 will support the regrowth of InP semiconductor material to be described below. Further, portions of the dielectric mask 121 have also been removed at surface 128 and at surface 130 in order to support the regrowth of the InP semiconductor material.

Figure 1C:
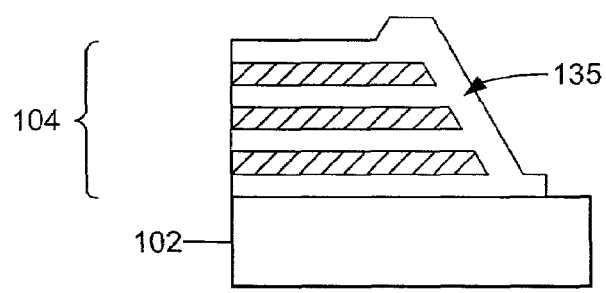

In FIG. 1C, an InP regrowth layer 135 is grown on the exposed surfaces 124, 128 and 130 of the epitaxial layer structure 100. The epitaxial layer structure 100 is placed in a MOCVD reactor for a short duration regrowth of InP, thus forming InP regrowth layer 135. During the regrowth of the InP layer 135, the indium phosphide grows only on the unmasked regions (124, 128 and 130) of the mesa. After regrowth of the InP layer 135, any remaining portions of the dielectric film 120 can be removed, thus leaving the InP regrowth support layer 135 on the mesa structure. Of course, if the first material were formed by deposition, then the support layer 135 would be deposited as well.

Figure 1D:
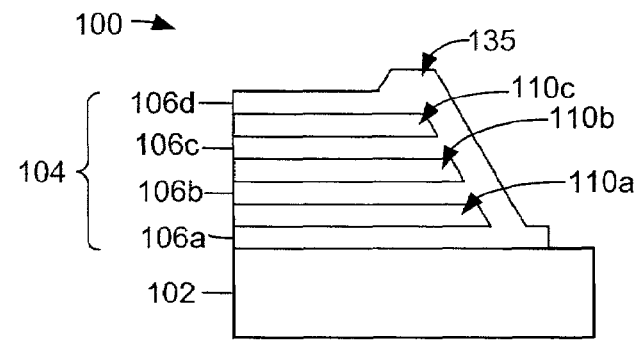

In FIG. 1D, after the InP regrowth layer 135 has been grown and the dielectric film 120 removed, a ferric chloride etch is applied to the layer structure 100, thus removing the sacrificial InGaAs layers 108a, 108b and 108c that were defined in the first growth shown above in FIG. 1A. The removal of the InGaAs sacrificial material leaves air gaps 110a, 110b and 110c in the areas vacated by the removal of the InGaAs sacrificial material 108a, 108b and 108c. In accordance with an aspect of the invention, the InP regrowth layer 135 acts as a mechanical support layer that supports the remaining layers 106a, 106b, 106c and 106d of the InP semiconductor material. The InP regrowth layer 135 maintains the layer thickness of the air gaps 110a, 110b and 110c following the removal of the sacrificial InGaAs layers defined in the first growth. The airgaps 110a, 110b and 110c may also be filled with other substances that provide a high index contrast with the layers of material at the gap/semiconductor interface. Such a substance may include, for example, an inert gas such as helium or nitrogen.

Figure 2A:
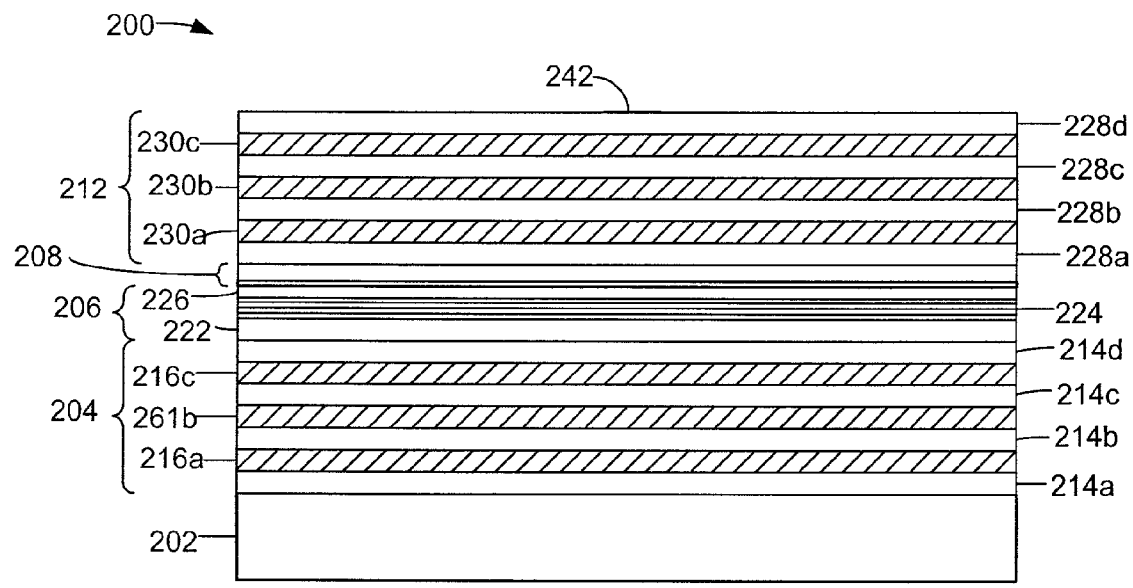
FIGS. 2A through 2D are schematic diagrams collectively illustrating the construction of a vertical-cavity surface-emitting laser (VCSEL) including airgap DBRs constructed in accordance with the invention.

FIGS. 2A through 2D are schematic diagrams collectively illustrating the construction of a vertical-cavity surface-emitting laser (VCSEL) including air gap DBRs constructed in accordance with an embodiment of the invention. Referring now to FIG. 2A, the epitaxial layers that form the first supported air gap DBR 204, the active region 206, the tunnel junction 208, and the second supported air gap DBR 212 are grown in a single MOCVD growth step upon a substrate layer 202. The layers that will form the first supported airgap DBR 204 include a plurality of alternating semiconductor layers 214a through 214d and sacrificial layers 216a through 216c. The semiconductor layers 214 are formed from InP and the sacrificial layers 216 are formed from InGaAs. The active region 206 is grown over the final semiconductor layer 214d of the first supported airgap DBR 204 and includes a lower cladding layer 222, an active layer 224 and an upper cladding layer 226. The active region 206 also includes a current confinement structure to constrict the current flow in the active region to the central portion of the active region. The current confinement structure can be formed using wet oxidation or ion implantation, and can be located, for example, under an etched tunnel junction or buried in a tunnel junction. Those having ordinary skill in the art will be familiar with the construction of a suitable active region 206 using the InP material system.

A tunnel junction 208 is formed over the active region 206 as known by those having ordinary skill in the art. The tunnel junction 208 can be either lattice-matched to InP or strained. Also the material from which the tunnel junction is constructed can be optically transparent or absorbing at the VCSEL wavelength. Because the tunnel junction 208 is a very thin structure, it can be placed within the standing wave null of the active region without introducing extra loss to the structure, even when formed using absorbing material. The tunnel junction 208 converts electrons into holes. The active region can be either p-type InP or n-type InP, which has much lower free-carrier loss that p-type InP.

The layers that will form the second supported airgap DBR 212 include a plurality of alternating semiconductor layers 228a through 228d and sacrificial layers 230a through 230c grown over the tunnel junction 206. The semiconductor layers 228 are formed of InP and the sacrificial layers 230 are formed of InGaAs. After the construction of the VCSEL structure 200, portions of the VCSEL structure 200 are covered by a suitable etch mask 242. The exposed portions of the VCSEL structure 200 are etched to form suitable mesa structures as mentioned above.

Figure 2B:
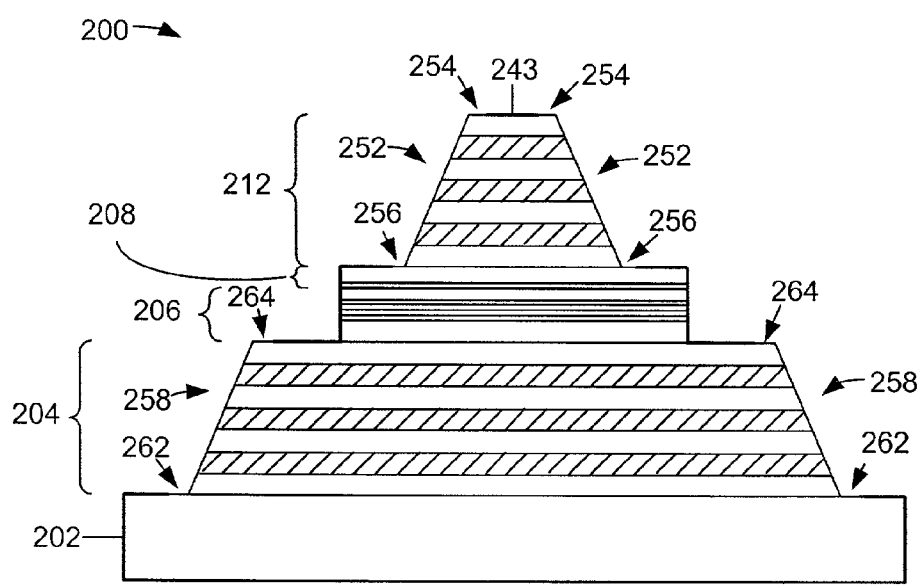

FIG. 2B is a schematic diagram illustrating the VCSEL structure 200 after the definition of a mesa structure for the layers that will form the first supported airgap DBR 204, the active region 206 and the layers that will form the second supported airgap DBR 212. Any remaining etch mask 242 is removed and a suitable dielectric mask 243 is applied to the mesa structures shown in FIG. 2B. Portions of the dielectric mask 243 are then selectively removed to expose surfaces 258 of the layers of the first supported airgap DBR 204 and surfaces 252 of the layers of the second supported airgap DBR 212. In addition, portion 262 of the InP substrate layer 202 and portion 264 of the semiconductor layer 214d have been selectively exposed. Further, portion 256 of the tunnel junction 208 and portion 254 of the semiconductor layer 228d are also selectively exposed.

Figure 2C:
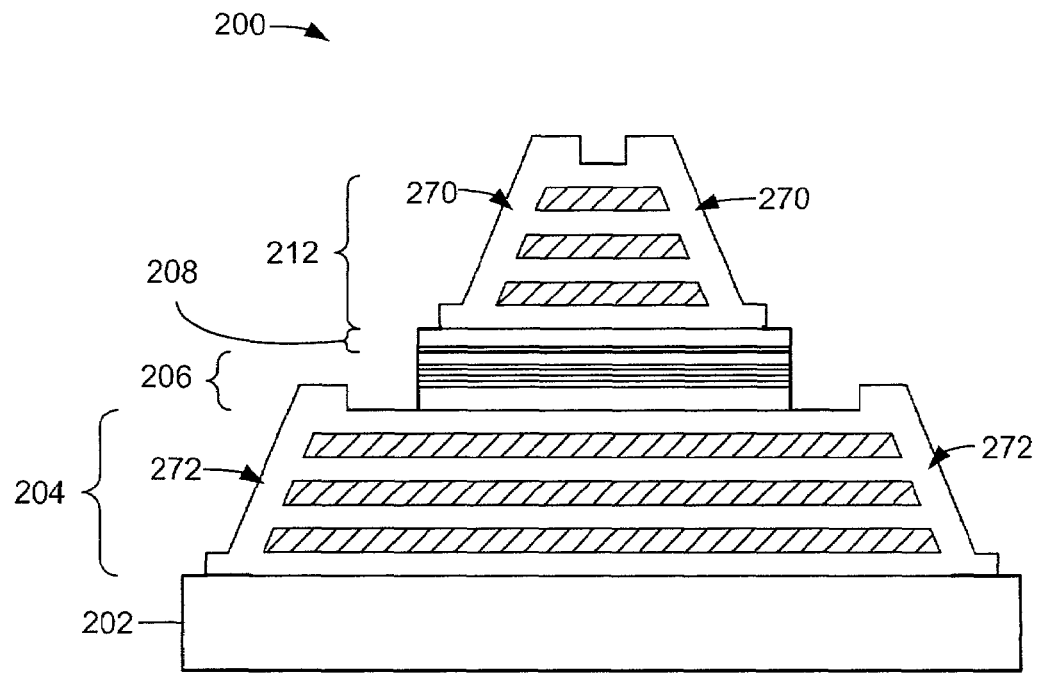

In FIG. 2C, a regrowth of an InP support layer on the exposed surfaces of the VCSEL structure 200 is illustrated. The InP regrowth layer 270 is grown on the exposed surfaces (252, 254 and 256 of FIG. 2B) and the InP regrowth layer 272 is grown on the exposed surfaces (258, 262 and 264 of FIG. 2B). The InP regrowth layers 270 and 272 are grown during a subsequent MOCVD growth step.

Figure 2D:
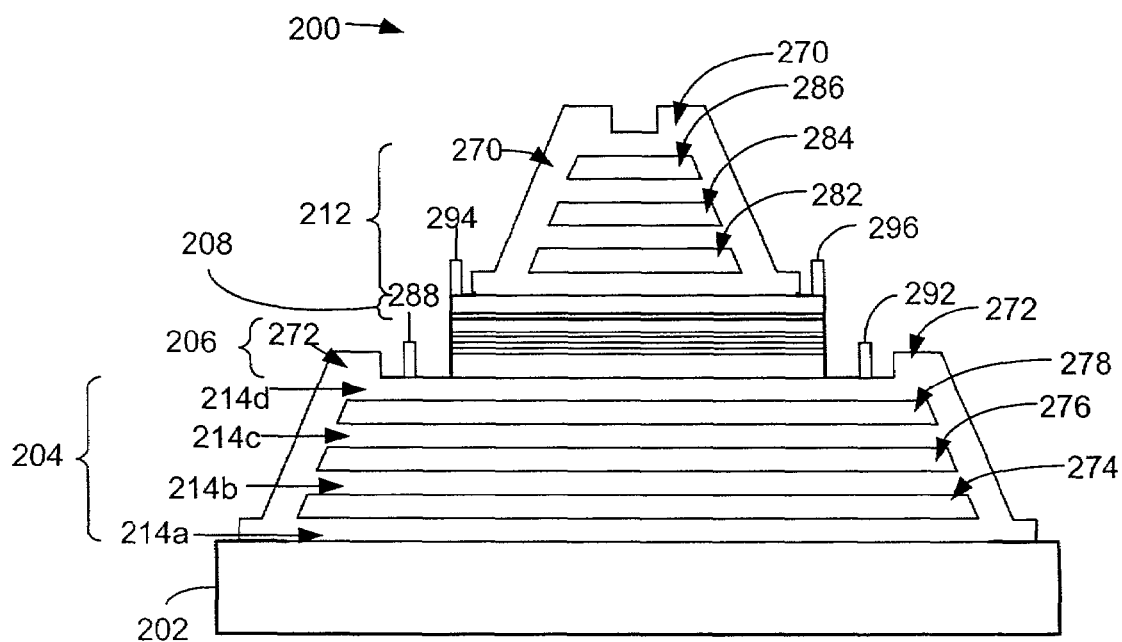

FIG. 2D is a schematic view illustrating the VCSEL structure 200 after the selective etch removal of the sacrificial InGaAs layers 216a, 216b and 216c of the first supported airgap DBR 204 and the InGaAs layers 230a, 230b and 230c of the second supported airgap DBR 212. After the selective removal of the sacrificial layers 216a, 216b and 216c of the first supported airgap DBR 204, airgaps 274, 276 and 278 remain in the first supported airgap DBR 204. Similarly, after the selective removal of the sacrificial layers 230a, 230b and 230c of the second supported airgap DBR 212, airgaps 282, 284 and 286 remain in the second supported airgap DBR 212. These "supported airgap DBRs" 204 and 212 provide a high index contrast with a relatively few number of layer pairs. The InP regrowth layer 270 supports the semiconductor layers 228a, 228b, 228c and 228d and the InP regrowth layer 272 supports the semiconductor layers 214a, 214b, 214c and 214d. Electrical contacts 288 and 292 are applied to portions of the semiconductor layer 214d and electrical contacts 294 and 296 are applied to portions of the tunnel junction 208 as shown.

The InP regrowth layers 270 and 272 improve the mechanical stability of the supported airgap DBRs 204 and 212. In this manner, large suspended structures can be fabricated and are resistant to the buckling and sticking forces described above. Furthermore, the good thermal conductivity of the InP regrowth layers 270 and 272 act as thermal pathways to extract heat from the VCSEL structure 200. The InP regrowth layers 270 and 272 can be doped with iron (Fe) to produce semi-insulating or non-conducting films while still providing good thermal conduction. Doping may also be introduced into the InP regrowth support layers 270 and 272 to provide conductive paths to funnel or constrict electrical current through the VCSEL structure 200. By using regrown single crystal and semiconductor support layers to form air/semiconductor DBRs for long wavelength VCSELs, the well developed active regions that emit light in the 1.3 to 1.5 μm wavelength spectrum available in the InP material system (aluminum indium gallium arsenide (AlInGaAs), indium gallium arsenide (InGaAs), indium gallium arsenide phosphide (InGaAsP), indium arsenide phosphide (InAsP), etc.) can be exploited. Furthermore, high-speed, low-current operation is possible due to the small mode size of such VCSELs. Further still, the wide stopband value of the airgap DBRs allows the possibility of fabricating long wavelength VCSELs and multi-wavelength VCSEL arrays by selective area growth of the active layers. Further, the wide stop band available for the air/semi-conductor DBRs also allows for improved manufacturing tolerance of the laser cavity. It is also possible to fabricate the VCSEL structure 200 using a dielectric mirror instead of the second supported airgap DBR 212.

Figure 3A:
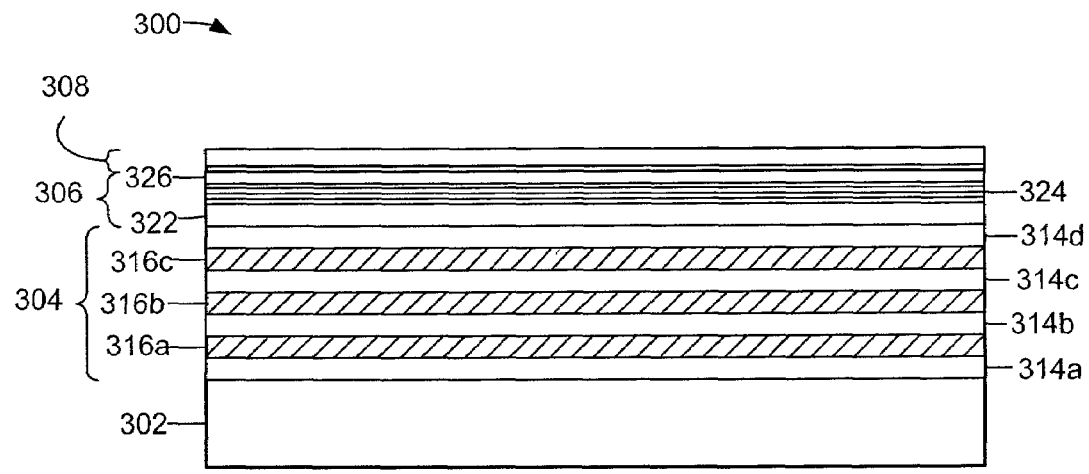
FIGS. 3A through 3D are schematic diagrams collectively illustrating an alternative embodiment of an airgap DBR used in a buried VCSEL structure.

FIGS. 3A through 3D are schematic diagrams collectively illustrating an alternative embodiment of an airgap DBR used in a buried VCSEL structure 300. Referring to FIG. 3A, the buried VCSEL structure 300 includes an InP substrate 302 upon which a plurality of alternating layers of semiconductor material and sacrificial material are grown. As described above with respect to FIG. 2A, the layers that will form the first DBR 302 include alternating layers of a semiconductor material 314a, 314b, 314c, 314d and alternating layers of a sacrificial material 316a, 316b, 316c. The layers 314a, 314b, 314c and 314d are formed of InP while the sacrificial layers 316a, 316b and 316c are formed of InGaAs. An active region 306, including a lower cladding layer 322 active layer 324 and upper cladding layer 326, is fabricated over the layers that will form the first supported airgap DBR 304. A tunnel junction 308 is formed over the active region 306.

Figure 3B:
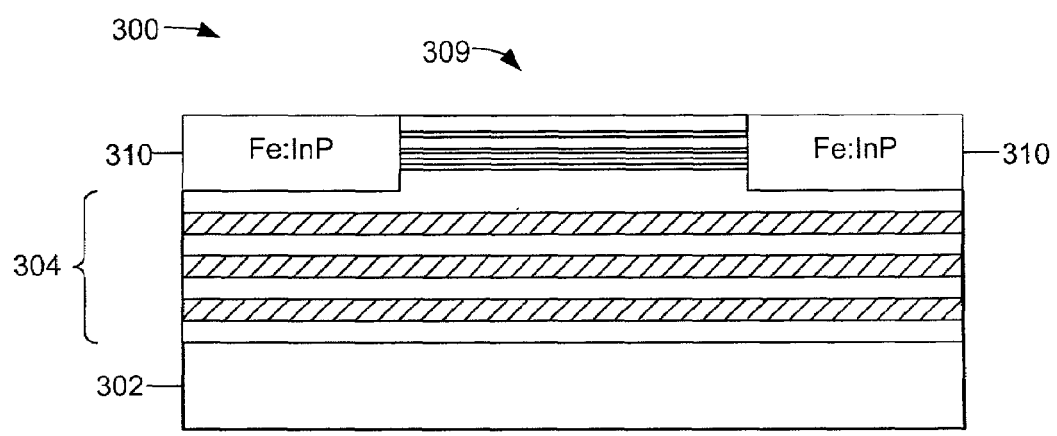

In FIG. 3B, portions of the buried VCSEL structure 300 are formed into a mesa structure. Specifically, the tunnel junction 308 and active region 306 are selectively etched to form a mesa structure 309. After the mesa structure 309 is formed, a regrowth of iron doped indium phosphide (Fe: InP) 310 is used as a planarizing layer over which a layer of n type InP will be grown to "bury" the tunnel junction 308 and active region 306.

Figure 3C:
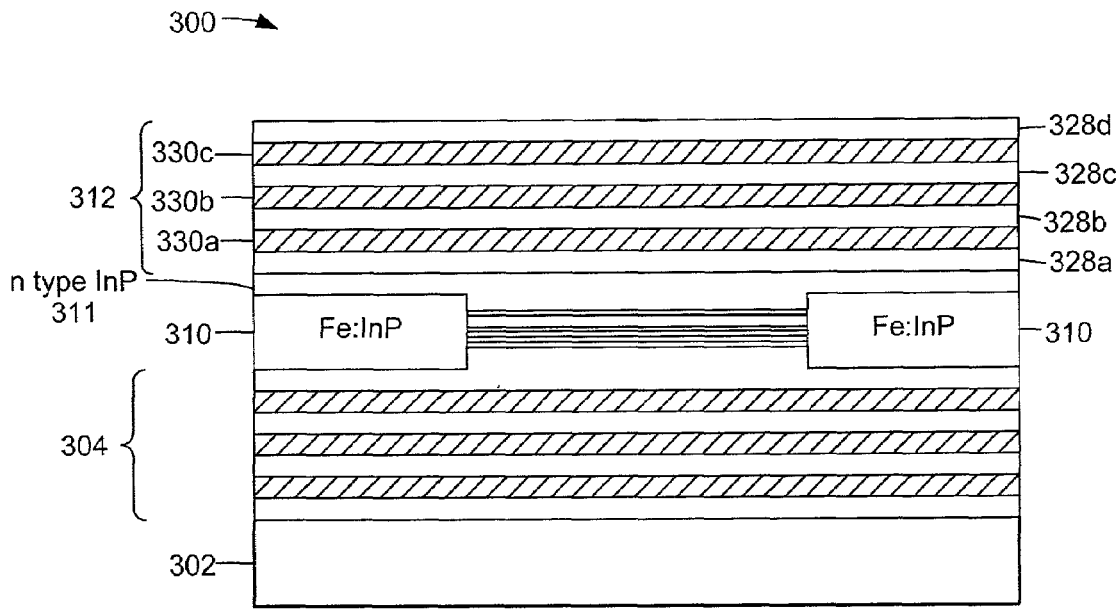

FIG. 3C is a schematic view illustrating the buried VCSEL 300 to which a layer 311 of n type InP is grown over the region 310 of iron doped InP and the tunnel junction 308. The layers that will form the second supported airgap DBR 312 include a plurality of alternating semiconductor layers 328a through 328d and sacrificial layers 330a through 330c grown over the n type InP layer 311. The semiconductor layers 328 are formed of InP and the sacrificial layers 330 are formed of InGaAs.

Figure 3D:
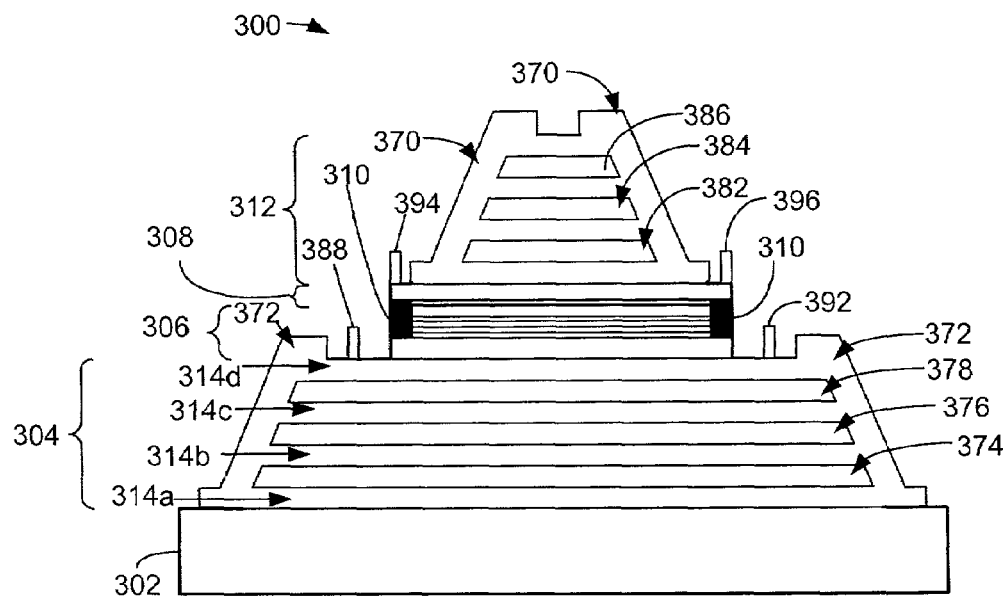

In FIG. 3D the layers that will form the first supported airgap DBR 304 and the layers that will form the second supported airgap DBR 312 are selectively etched to form mesa structures. A dielectric mask (not shown) is applied to all exposed surfaces of the mesa structure as described above. Portions of the mesa structure upon which regrowth of InP is desired are exposed through the dielectric film as described above. The InP regrowth layers 370 and 372 are similar to the InP regrowth layers 270 and 272 of FIG. 2D. After the InP regrowth layers 370 and 372 are grown, the sacrificial layers 316a, 316b and 316c of the first supported airgap DBR 304, and the sacrificial layers 330a, 330b and 330c of the second supported airgap DBR 312 are selectively removed using a ferric chloride etch. The ferric chloride etch exposes the airgaps 374, 376 and 378 in the first supported airgap DBR 304 and exposes the airgaps 382, 384 and 386 in the second supported airgap DBR 312. Electrical contacts 388 and 392 are applied to portions of the semiconductor layer 314d and electrical contacts 394 and 396 are applied to portions of the n type InP layer 311 as shown.

The InP regrowth layers 370 and 372 allow precise control of the thickness of the airgap layers necessary for the fabrication of optical devices such as the VCSELs shown in FIGS. 2A through 2D and FIGS. 3A through 3D. Furthermore, a variety of optical devices that use a single epitaxial growth step followed by one or more subsequent regrowth steps can be used. For example, tunable filters, tunable detectors and tunable lasers can be fabricated using the supported airgap processing technology described above.

Figure 4A:
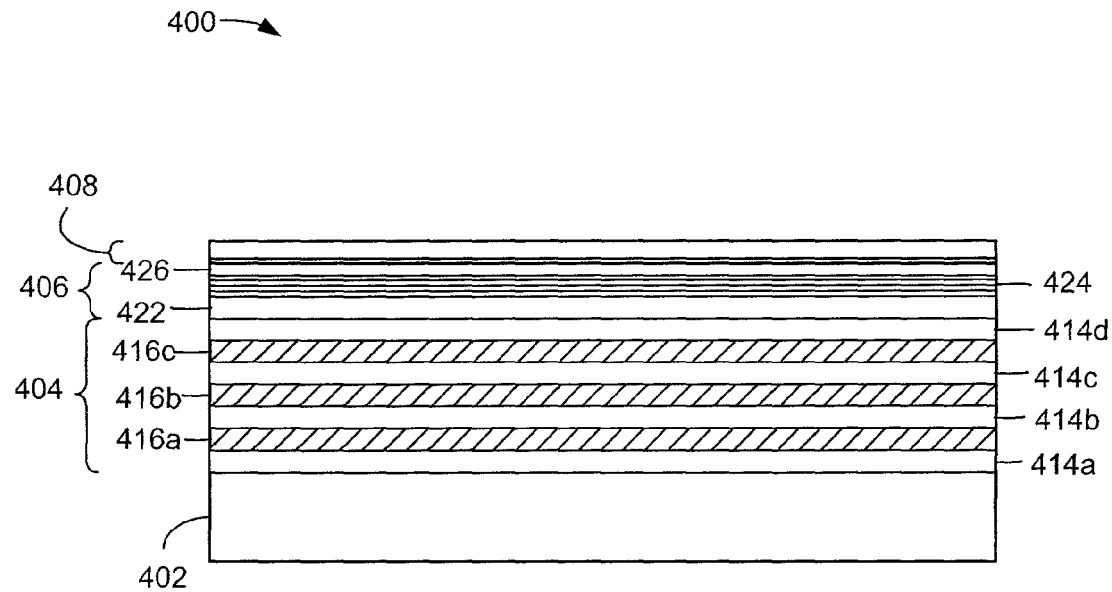
FIGS. 4A through 4D are schematic diagrams collectively illustrating an alternative embodiment of the buried VCSEL structure of FIGS. 3A through 3D.

FIGS. 4A through 4D are schematic diagrams collectively illustrating an alternative embodiment 400 of the buried VCSEL structure of FIGS. 3A through 3D. The VCSEL 400 shown in FIGS. 4A through 4D includes a tunable cavity and allows the output frequency of the VCSEL 400 to be dynamically altered. Referring to FIG. 4A, the tunable VCSEL 400 includes an InP substrate 402 upon which a plurality of alternating layers of semiconductor material and sacrificial material are grown. As described above with respect to FIG. 3A, the layers that will form the first DBR 402 include alternating layers of a semiconductor material 414a, 414b, 414c, 414d and alternating layers of a sacrificial material 416a, 416b, 416c. The layers 414a, 414b, 414c and 414d are formed of InP while the sacrificial layers 416a, 416b and 416c are formed of InGaAs. An active region 406, including a lower cladding layer 422 active layer 424 and upper cladding layer 426, is fabricated over the layers that will form the first supported airgap DBR 404. A tunnel junction 408 is formed over the active region 406.

Figure 4B:
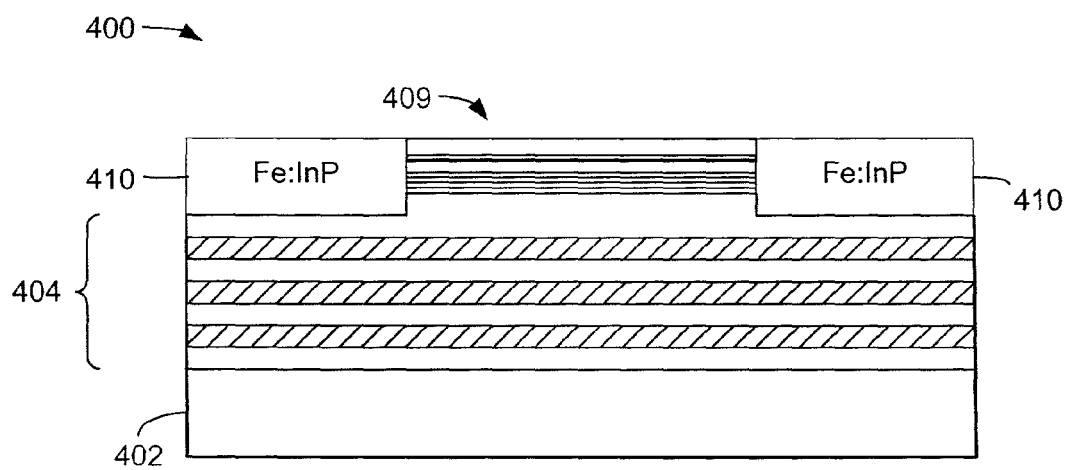

In FIG. 4B, portions of the VCSEL structure 400 are formed into a mesa structure. Specifically, the tunnel junction 408 and active region 406 are selectively etched to form a mesa structure 409. After the mesa structure 409 is formed, a regrowth of iron doped indium phosphide (Fe: InP) 410 is used as a planarizing layer, over which an additional sacrificial layer of InGaAs and a layer of conducting n type InP will be grown to "bury" the tunnel junction 408 and active region 406.

Figure 4C:
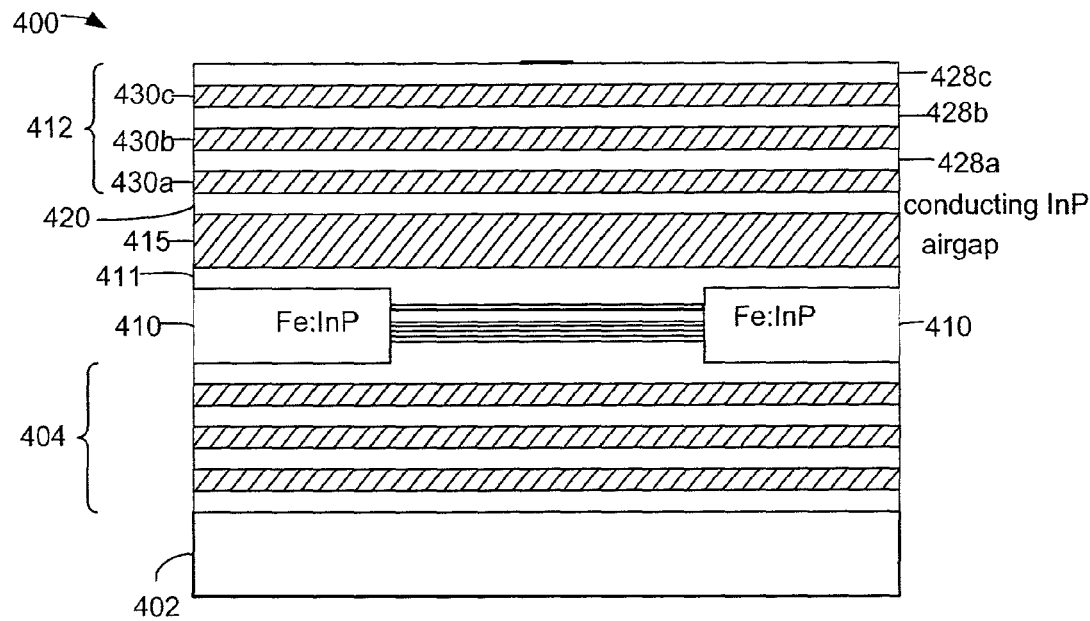

FIG. 4C is a schematic view illustrating the tunable VCSEL 400 to which a layer 411 of n type InP is grown over the region 410 of iron doped InP and the tunnel junction 408. In accordance with this embodiment of the invention, an additional sacrificial layer 415 of InGaAs is grown over the layer 411 and a layer 420 of conductive InP is grown over the sacrificial layer 415. The layers that will form the second supported airgap DBR 412 include a plurality of alternating semiconductor layers 428a through 428c and sacrificial layers 430a through 430c grown over the conductive InP layer 420. Note that the supported airgap DBR 412 includes three layer pairs. The semiconductor layers 428 are formed of InP and the sacrificial layers 430 are formed of InGaAs.

Figure 4D:
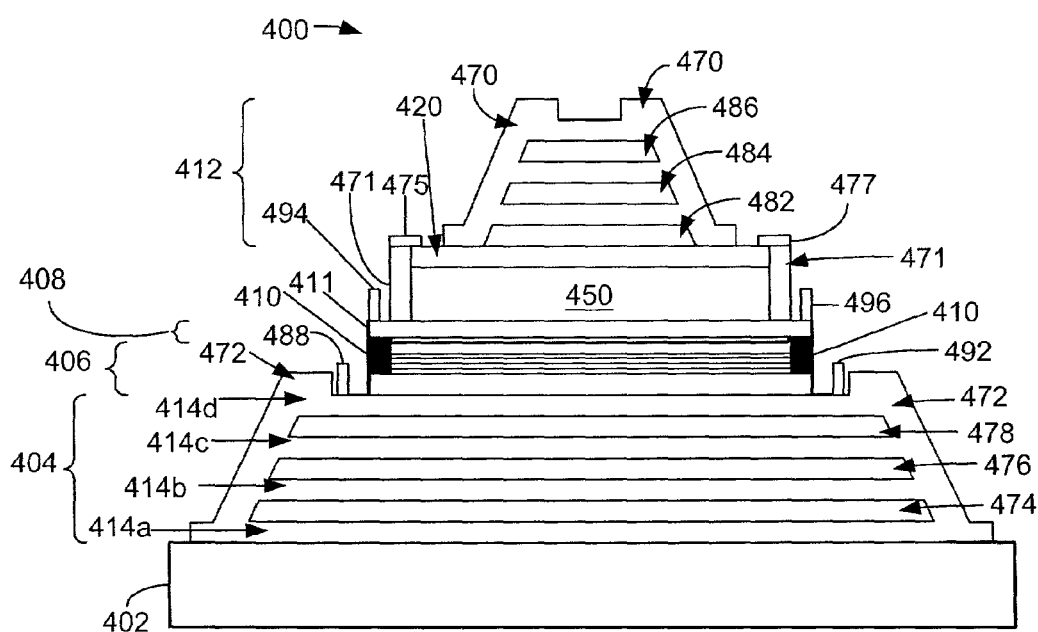

In FIG. 4D the layers that will form the first supported airgap DBR 404 and the layers that will form the second supported airgap DBR 412 are selectively etched to form mesa structures. A dielectric film (not shown) is applied to all exposed surfaces of the mesa structure as described above. Portions of the mesa structures upon which regrowth of InP is desired are exposed through the dielectric film as described above. The InP regrowth layers 470 and 472 are similar to the InP regrowth layers 370 and 372 of FIG. 3D. However, for the tunable VCSEL 400, there is an additional InP regrowth layer 471 grown adjacent the additional sacrificial layer 415 and the conductive InP layer 420.

After the InP regrowth layers 470, 471 and 472 are grown, the sacrificial layers 416a, 416b and 416c of the first supported airgap DBR 404, the sacrificial layers 430a, 430b and 430c of the second supported airgap DBR 412 and the additional sacrificial layer 415 are selectively removed using a ferric chloride etch. The ferric chloride etch exposes the airgaps 474, 476 and 478 in the first supported airgap DBR 404, exposes the airgaps 482, 484 and 486 in the second supported airgap DBR 412 and exposes the airgap 450. Electrical contacts 488 and 492 are applied to portions of the semiconductor layer 414d and electrical contacts 494 and 496 are applied to portions of the n type InP layer 411 as shown. Furthermore, tuning contacts 475 and 477 are applied to portions of the InP regrowth layer 471 and the conductive InP layer 420 as shown. By applying an appropriate voltage to the tuning contacts 475 and 477, the frequency of the output of the tunable VCSEL 400 can be dynamically varied by varying the position of the layer 420 of conductive InP.

It will be apparent to those skilled in the art that many modifications and variations may be made to the preferred embodiments of the present invention, as set forth above, without departing substantially from the principles of the present invention. For example, any epitaxial layer structure that includes layers of material separated by gaps can benefit from the concepts of the invention. The gaps may contain air or other substances that provide a high index contrast with the layers of material. Further, any semiconductor laser device in which a high index contrast DBR is desired can benefit from the use of the airgap supported DBRs disclosed above. All such modifications and variations are intended to be included herein within the scope of the present invention, as defined in the claims that follow.

What is claimed is:

1. A vertical-cavity surface-emitting laser (VCSEL), comprising:
  a substrate;
  a distributed Bragg reflector formed over the substrate and including a plurality of semiconductor material layers separated by air gaps;
  an active region formed over the distributed Bragg reflector, the active region including a current confinement region and a tunnel junction;
  an air gap located adjacent the active region;
  a second reflector formed over the active region;
  a conductive layer located between the air gap and the second reflector;

electrical contacts associated with the active region and the distributed Bragg reflector;

where the distributed Bragg reflector includes a support layer to support the layers of semiconductor material; and an additional set of electrical contacts associated with the conductive layer, the additional set of electrical contacts configured to receive an electrical signal and alter the light output wavelength of the VCSEL by causing the conductive layer to move in response to the electrical signal resulting in a tunable VCSEL.

2. The VCSEL of claim 1, wherein the semiconductor material is indium phosphide (InP).

3. The VCSEL of claim 1, wherein the semiconductor material is chosen from the group consisting of any material in the indium phosphide (InP) material system.

4. The VCSEL of claim 1, further comprising an additional semiconductor material layer formed between the active region and the second reflector.

5. The VCSEL of claim 1, wherein the second reflector is an air gap supported distributed Bragg reflector.

6. The VCSEL of claim 1, wherein the second reflector is a dielectric distributed Bragg reflector.

7. The VCSEL of claim 1, wherein the support layer is a regrowth of the semiconductor material.

* * * * *